(12) United States Patent
Shibuya et al.

(10) Patent No.: US 10,283,409 B2
(45) Date of Patent: May 7, 2019

(54) INTEGRATED CLIP AND LEAD AND METHOD OF MAKING A CIRCUIT

(71) Applicant: TEXAS INSTRUMENTS INCORPORATED, Dallas, TX (US)

(72) Inventors: Makoto Shibuya, Beppu (JP); Makoto Yoshino, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/585,519

(22) Filed: May 3, 2017

(65) Prior Publication Data

US 2017/0236754 A1  Aug. 17, 2017

Related U.S. Application Data

(62) Division of application No. 14/709,074, filed on May 11, 2015, now Pat. No. 9,673,097.

(51) Int. Cl.

| H01L 23/495 | (2006.01) |
|---|---|
| H01L 21/78 | (2006.01) |
| H01L 23/492 | (2006.01) |
| H01L 21/56 | (2006.01) |
| H01L 23/498 | (2006.01) |
| H01L 23/00 | (2006.01) |

(52) U.S. Cl.
CPC ............ *H01L 21/78* (2013.01); *H01L 21/561* (2013.01); *H01L 21/565* (2013.01); *H01L 23/492* (2013.01); *H01L 23/49524* (2013.01); *H01L 23/49537* (2013.01); *H01L 23/49551* (2013.01); *H01L 23/49575* (2013.01); *H01L 23/49861* (2013.01); *H01L 24/37* (2013.01); *H01L 24/40* (2013.01); *H01L 23/4952* (2013.01); *H01L 2224/37147* (2013.01); *H01L 2224/40245* (2013.01); *H01L 2224/84801* (2013.01); *H01L 2924/00014* (2013.01); *H01L 2924/181* (2013.01)

(58) Field of Classification Search
CPC ... H01L 21/78; H01L 21/4825; H01L 21/561; H01L 21/565; H01L 23/492; H01L 23/49517; H01L 23/4952; H01L 23/49524; H01L 23/49537; H01L 23/49551; H01L 23/49575; H01L 23/49861; H01L 23/5381; H01L 24/40; H01L 2224/37147; H01L 2224/40245; H01L 2924/00014; H01L 2924/181
USPC ......................................................... 257/673
See application file for complete search history.

(56) References Cited

U.S. PATENT DOCUMENTS

| 4,926,542 | A | 5/1990 | Bougger |
| 7,138,673 | B2* | 11/2006 | Tanaka ............... H01L 23/49562 257/288 |
| 8,933,518 | B2* | 1/2015 | Xue ........................ H01L 24/34 257/401 |

(Continued)

*Primary Examiner* — Tu-Tu V Ho
(74) *Attorney, Agent, or Firm* — Rose Alyssa Keagy; Charles A. Brill; Frank D. Cimino (57) ABSTRACT

A circuit includes a conductive clip coupled to at least one component in the circuit. At least one lead portion is located on an end of the clip. The circuit further includes a first lead frame having at least one opening sized to receive the at least one lead portion. The at least one lead portion is received in the at least one opening and the at least one lead portion is an external conductor of the circuit.

10 Claims, 6 Drawing Sheets

(56) References Cited

U.S. PATENT DOCUMENTS

| | | | |
|---|---|---|---|
| 2006/0108671 A1* | 5/2006 | Kasem | H01L 23/3107 |
| | | | 257/676 |
| 2006/0214290 A1 | 9/2006 | Xiaochun et al. | |
| 2007/0215996 A1 | 9/2007 | Otremba | |
| 2008/0023807 A1 | 1/2008 | Noquil et al. | |
| 2009/0189266 A1 | 7/2009 | Liu et al. | |
| 2011/0227205 A1* | 9/2011 | Lu | H01L 23/49524 |
| | | | 257/670 |
| 2012/0119343 A1* | 5/2012 | Bayan | H01L 21/4842 |
| | | | 257/676 |
| 2012/0292754 A1 | 11/2012 | Cho | |
| 2014/0154843 A1 | 6/2014 | Liu et al. | |
| 2016/0268185 A1* | 9/2016 | McKnight-Macneil | |
| | | | H01L 23/49562 |

* cited by examiner

INTEGRATED CLIP AND LEAD AND METHOD OF MAKING A CIRCUIT

CROSS REFERENCE TO RELATED APPLICATION

This divisional application claims priority to and benefit of U.S. patent application Ser. No. 14/709,074 (TI-75324), filed on May 11, 2015, the entirety of which is incorporated herein by reference.

BACKGROUND

Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small-outline no-leads (SON) devices, are based on a surface-mount technology that connects integrated circuits to the surfaces of printed circuit boards without through-holes in the printed circuit boards. In some examples, flat no-lead packages are near chip scale plastic encapsulated packages typically fabricated with a planar copper lead frame substrate. Perimeter lands on the package provide electrical coupling to the printed circuit board. The lands serve as contacts and may be referred to as leads internal to the integrated circuit, however, the leads do not extend beyond the boundaries of the integrated circuit package.

Some integrated circuits and other electronic devices have conductive clips that are coupled to electronic components within the circuits and devices. The clips may be on one plane and the leads or contacts for the circuits and devices may be on a second plane. The clips are soldered or otherwise electrically and/or mechanically bonded to the leads, which yields additional resistance between the devices and the external contacts of the integrated circuit. The bond also provides a weak spot in the circuits and devices. For example, the bonds are susceptible to cracking and other failures which may yield the circuits and devices inoperable.

SUMMARY

A circuit includes a conductive clip coupled to at least one component in the circuit. At least one lead portion is located an end of the clip. The circuit further includes a first lead frame having at least one opening sized to receive the at least one lead portion. The at least one lead portion is received in the at least one opening and the at least one lead portion is an external conductor of the circuit.

DETAILED DESCRIPTION

Figure 1:
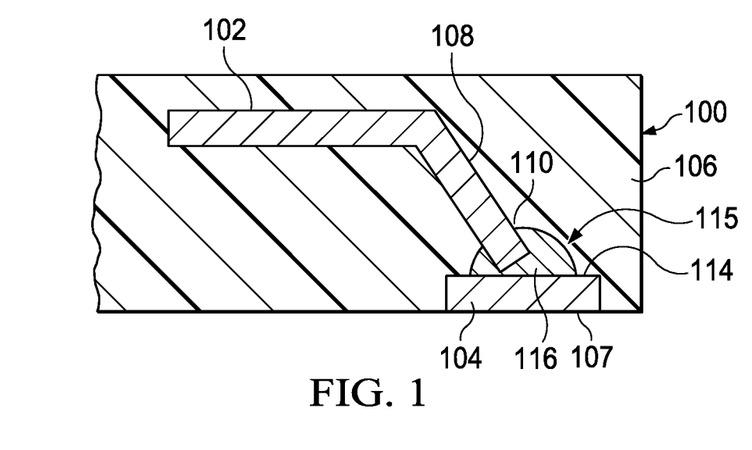
FIG. 1 is a side cross sectional view of a portion of a device showing the bonding between a clip and a lead.

FIG. 1 is a side cross sectional view of a portion of an electronic device 100 showing the bonding between a clip 102 and a lead 104. Examples of the device 100 include an integrated circuit in a quad-flat no-leads (QFN) or a dual-flat no-leads (DFN) package. The clip 102 is a conductive material, such as copper that is coupled to at least one electronic component (not shown in FIG. 1) within a circuit or integrated circuit. In some embodiments, the clip 102 is electrically coupled to the source or drain of at least one field effect transistor (FET). The lead 104 is also a conductive material and serves as a lead for the device 100 to couple the device 100 to other electronic devices. For example, the lead 104 may electronically and mechanically couple the device 100 to a conductor on a printed circuit board.

The device 100 is incased in a mold 106 that is applied by conventional molding techniques. The lead 104 has a surface 107 that is not encased by the mold 106 and serves as a conductive land for the device 100. During assembly of the device 100 to a printed circuit board (not shown), the surface 107 is set on a bonding material, such as solder on the surface of a printed circuit board. After curing the bonding material, the device 100 is electrically and mechanically coupled to the printed circuit board without the use of through holes in the printed circuit board.

The clip 102 and the lead 104 are on different planes, so the clip 102 has an angled portion 108 that brings an end 110 of the clip 102 to the plane of the lead 104. The end 110 of the clip 102 is located proximate a surface 114 of the lead 104 and is mechanically and electrically coupled to the surface 114 at a bonded region 115 by way of a bonding compound 116. In some embodiments, the bonding compound 116 is solder or a conductive epoxy that commonly bonds clips and leads together.

Figure 2:
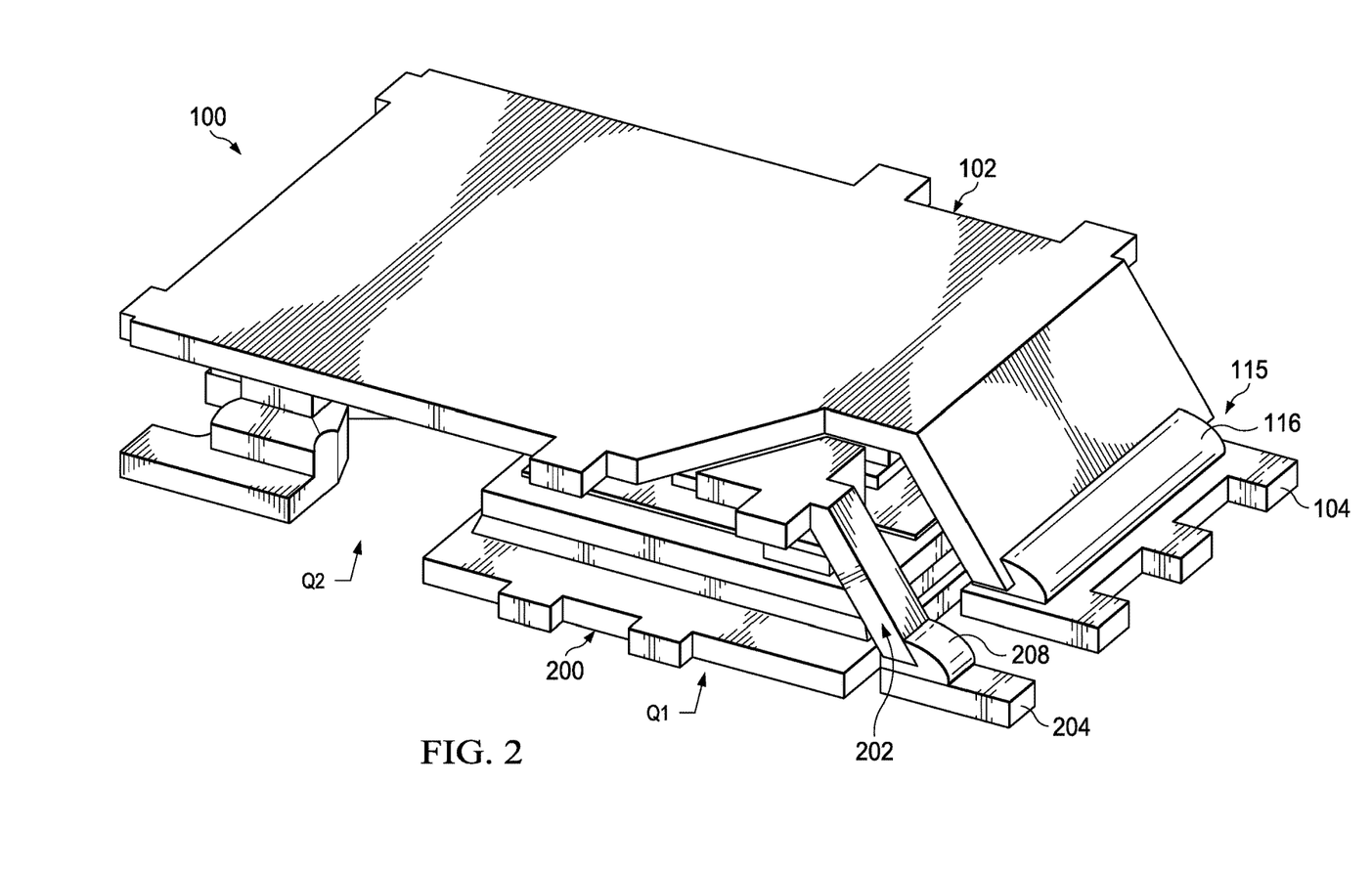
FIG. 2 is a top isometric view of the whole device of FIG. 1 showing the bonding between the clip and the lead.

Additional reference is made to FIG. 2, which is a top isometric view of an example of the device 100 of FIG. 1. The clip 102 is electrically coupled to electronic components, which in the embodiment of FIG. 2 are transistors Q1 and Q2. The transistor Q1 is also electrically and mechanically coupled to a clip 200. For example, the clip 102 may be coupled to the source of the transistor Q1 and the clip 200 may be coupled to the drain of the transistor Q1. The clip 200 may be electrically coupled to a lead that is not shown in FIG. 2 that couples the drain of the transistor Q1 to external circuits or devices. The gate of the transistor Q1 is coupled to a clip 202, which is bonded to a lead 204 by way of bonding material 208. The clip 102 is electrically and mechanically bonded to the source of the transistor Q2.

The bonds between the clip 102 and the lead 104 and the clip 202 and the lead 204 present some electrical and mechanical problems. Referring to the bond between the clip 102 and the lead 104, the bond creates a relatively high resistance between the clip 102 and the lead 104. For example, resistances are in the following locations: the clip 102; the contact between the clip 102 and the bonding material 116; the bonding material 116; the contact between the bonding material 116 and the lead 104; and the lead 104.

These resistances are in series and may be greater than the resistance of the material of the clip 102 and the lead 104, which may be low resistance copper. Accordingly, the bonding of the clip 102 to the lead 104 may provide a relatively high resistance between electronic components coupled to the clip 102 and the lead 104, which may negatively impact the functions of these components.

Figure 3:
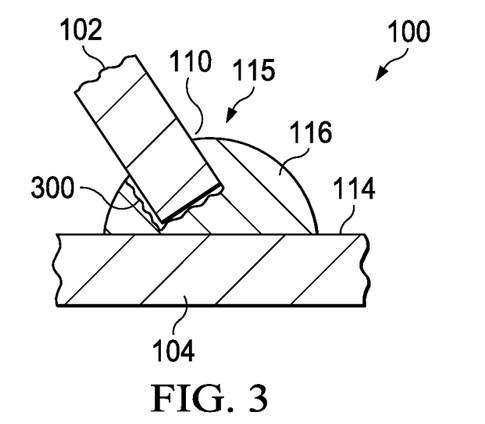
FIG. 3 is an expanded, cutaway view of the bond between the clip and the lead of FIGS. 1 and 2 showing the location of a crack in the bond.

Mechanically, the bond between the clip 102 and the lead 104 presents a weak spot in the device 100 that is susceptible to cracking or other failures. FIG. 3 is an expanded, cutaway view of the bonded region 115 between the clip 102 and the lead 104 of FIGS. 1 and 2 showing the location of a crack 300 in the bonding material 116. The crack 300 may be caused by stresses, such as stressing due to expansion and contraction as a result of temperature changes or other factors that stress the bonding material 116, the clip 102, and/or the lead 104. The crack 300 is located in the bonding material 116, so it may increase the resistance in the bond material 116 and exacerbate the above-described problems with high resistance between the clip 102 and the lead 104. In some situations, the crack 300 may cause a complete disconnection between the clip 102 and the lead 104, which may lead to a failure of the device 100.

Figure 4:
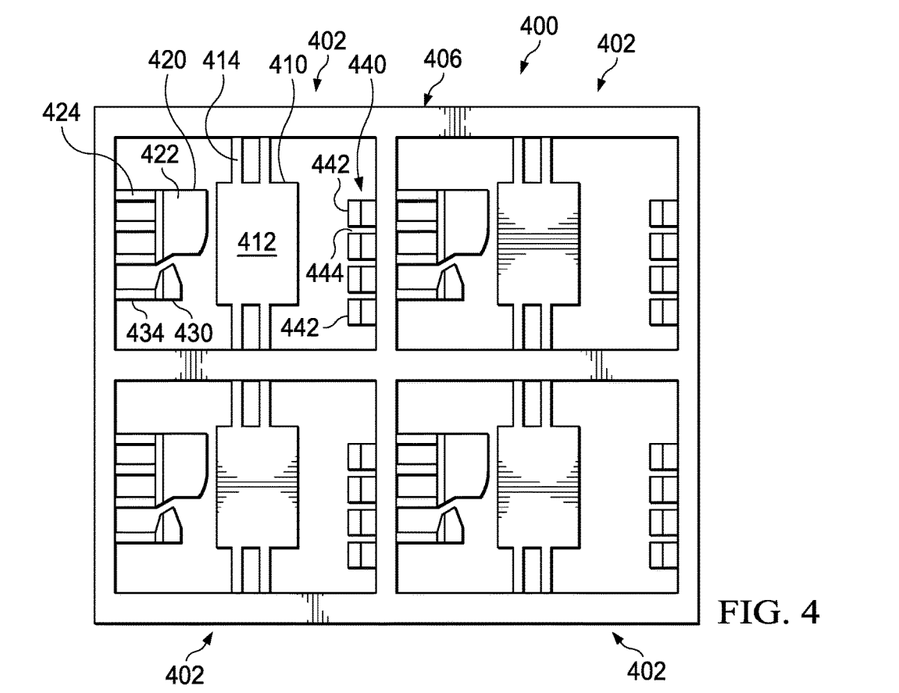
FIG. 4 is a top plan view of an example of a first lead frame.

The devices described herein overcome the above-described problems associated with the bond between a clip and a lead by forming or fabricating a clip and a lead as a single device rather than two devices that are bonded together. Reference is made to FIG. 4, which is a top plan view of a first lead frame 400 and FIG. 5, which is a top plan view or a second lead frame 500. The lead frames 400 and 500 are portions of dual FET devices wherein the FETs are electrically coupled in series and physically arranged side by side. The use of dual FET devices is an example of the many applications wherein clips may be fabricated into leads as described herein.

The first lead frame 400 has a plurality of portions 402 wherein each of the portions 402 constitutes a single device having dual FETs, which are referred to herein as a first FET and a second FET. In the example of FIG. 4, the first lead frame 400 has four portions 402, however, any number of portions 402 may be present. The portions 402 are bounded by a frame 406 that supports components within the portions 402 and connects the portions 402 to one another.

In the example of FIG. 4, the first lead frame 400 has a first clip or conductor 410 on which a node of the first FET is fabricated. In the examples described herein, the drain of the first FET is fabricated onto the surface 412 of the first conductor 410. A plurality of retainers 414 connect the first conductor 410 to the frame 402 and serves to maintain the first conductor 410 in a fixed position relative to the frame 402 during fabrication. Later processes in fabrication cut the retainers 414 so they serve as conductors to couple the first FET to other circuits and/or electronic components.

A second clip or conductor 420 has a surface 422 on which the source of the second FET is fabricated. A plurality of retainers 424 connect the second conductor 420 to the frame 402 and serves to maintain the second conductor 420 in a fixed position relative to the frame 402 during fabrication. As with the first conductor 410, the retainers 424 are cut during later fabrication processes and serve as conductors to couple the second FET to other circuits and/or electronic components. A third clip or conductor 430 couples to the gate of the second FET. A retainer 434 connects the third conductor 430 to the frame 402 and serves the same function as the retainers 414 and 424.

Figure 5:
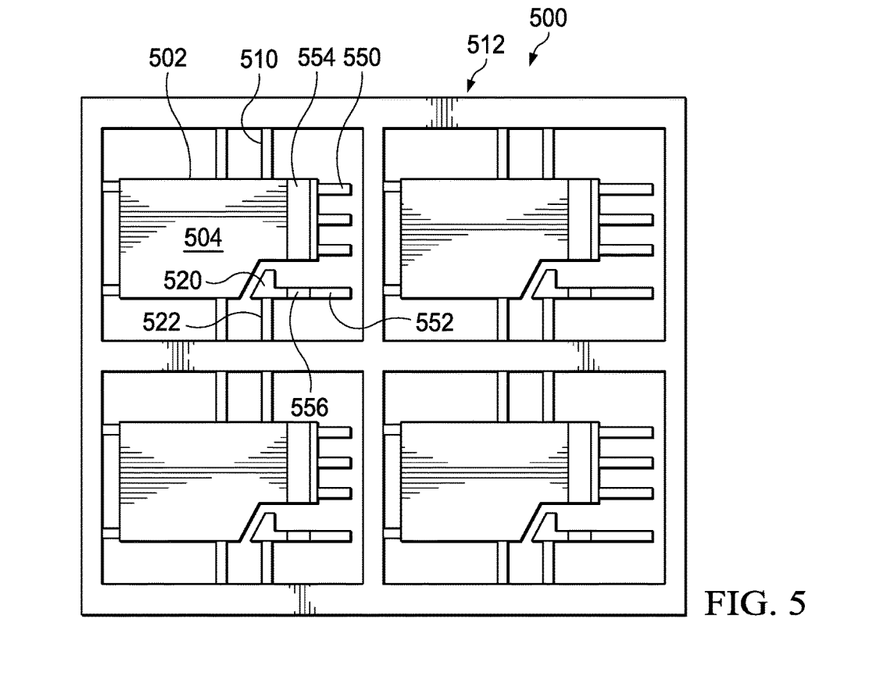
FIG. 5 is a top plan view of an example of a second lead frame.

A plurality of retainers 440 extend from the frame 402 and serve to receive portions of the second lead frame 500 as described in greater detail below. The retainers 440 include a plurality of tabs 442 separated by spaces 444, wherein portions of the second lead frame 500 are received into the spaces 444 as described in greater detail below.

Figure 6:
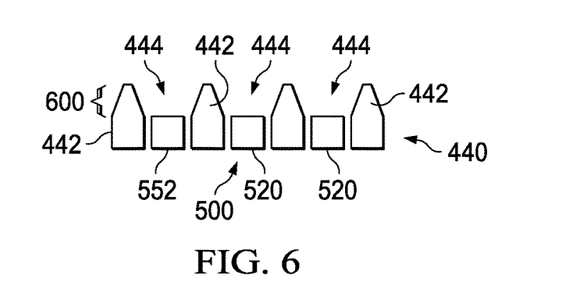
FIG. 6 is a cutaway, elevation view showing an example of the tabs on the lead frame of FIG. 4.

FIG. 6 is a cutaway, elevation view showing an example of the retainers 440 of FIG. 4. In the example of FIG. 6, portions of the second lead frame 500 are filling the spaces 444 between the tabs 442. The tabs 442 have extended portions 600 that extend beyond the height of the second lead frame 500. In the example of FIG. 6, the extended portions 600 are pointed or substantially triangular. The extended portions 600 provide metal to fill spaces between the tabs 442 and the second lead frame 500 during a swaging process.

Referring again to FIG. 5, the second lead frame 500 has a first clip or conductor 502 with a surface 504. The surface 504 is a top surface of the device containing the FETs and in some embodiments it is an external surface of the device. The first conductor 502 has a surface (not shown in FIG. 5) that is opposite the surface 504 on which both the source of the first FET and the drain of the second PET are fabricated. The second lead frame 500 has a plurality of retainers 510 that connect the first conductor 502 to a frame 512, wherein the frame 512 functions in the same manner as the frame 402 of FIG. 4. A second clip or conductor 520 couples to the gate of the first FET. The second conductor 520 is maintained in a fixed location relative to the frame 512 by a retainer 522.

The first conductor 502 has a plurality of leads 550 extending from a body portion and the second conductor 520 has a lead 552 extending from a body portion. The leads 550 and 552 are sometimes referred to as lead portions. The leads 550 are connected to the first conductor 502 by way of a transition 554 and the lead 552 is connected to the second conductor 520 by way of a transition 556. The transitions 554 and 556 lower the leads 550 and 552 to a plane or planes that are lower than a plane on which the body portions of the first conductor 502 and the second conductor 520 are located. The leads 550 and 552 are integrally formed with other components in the first conductor 502.

During fabrication, the materials for the sources, gates, and drains of the FETs are fabricated onto the conductors of the lead frames 400 and 500. For example, the components of the FETs may be fabricated onto or be electrically coupled to the conductors 410, 420, and 430. An example of the layers in the FETs are described further below. The second lead frame 500 may then be placed onto the first lead frame 400 and solder bonds or other bonds may be cured to form the FETs.

Figure 7:
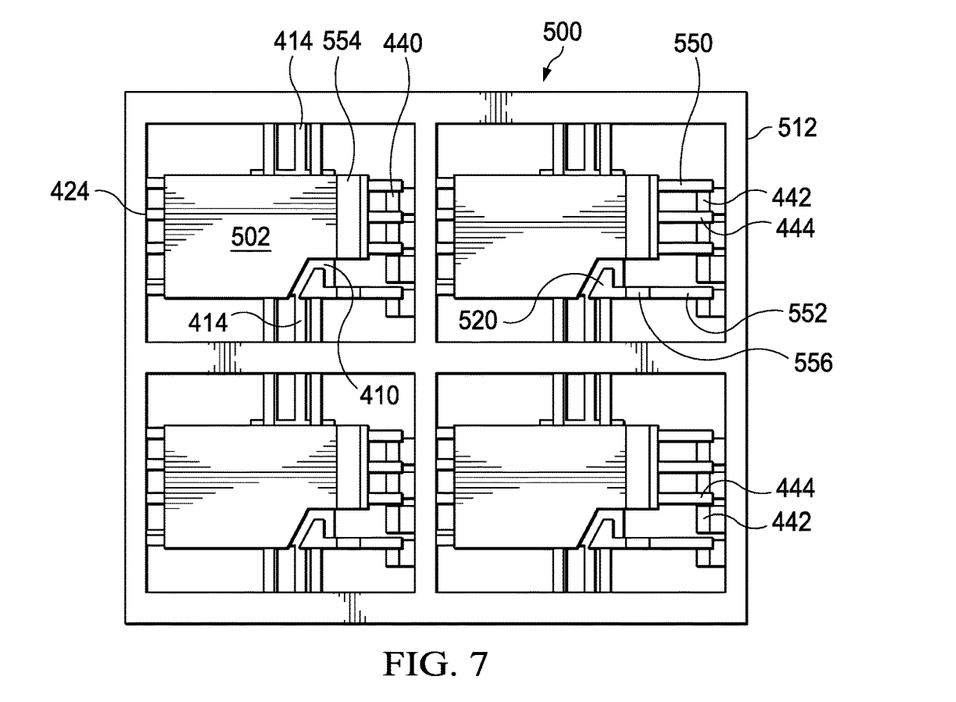
FIG. 7 is a top plan view of the lead frames of FIGS. 4 and 5 after they have been placed together.

FIG. 7 is a top plan view of the lead frames 400 and 500 of FIGS. 4 and 5 after they have been placed together. The view of FIG. 7 is a top view wherein the second lead frame 500 has been placed on top of the first lead frame 400. As shown in FIG. 7, the leads 550 of the first conductor 502 and the lead 552 of the second conductor 520 are received into the spaces 444 of the retainers 440. The placement of the leads 550 and 552 within the retainers 440 is shown by the elevation view of FIG. 6. The solder and/or other bonding materials in the FETs are cured after the leads 550 and 552 are received in the spaces 444.

Figure 8:
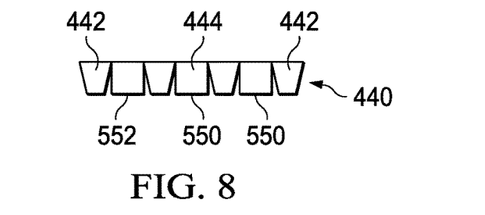
FIG. 8 is a side elevation vie of the clips of FIG. 5 attached to the leads after a swaging process.

At this point of fabrication, the bonding materials within the FETs are cured and the lead frames 400 and 500 need to be encased with a molding compound prior to singulation. The leads 550 and 552 are secured to the retainers 440 prior to molding, which secures the leads 550 and 552 in a secure location during the molding and singulation processes. Reference is made to FIG. 8, which shows the retainers 440 attached to the leads 550 and 552 after a swaging process.

With additional reference to FIG. 6, the swaging process has crushed or deformed the top portions 600 of the retainers 440 into the leads 550 and 552, which secures the leads 550 and 552 in fixed locations. Accordingly, the leads 550 and 552 are on a lower plane than the conductors 502 and 520, FIG. 5 and they will not move when the pressures associated with molding are applied to the lead frames 400 and 500. Other techniques may be applied to secure the leads 550 and 552 to the first retainers 440, such as caulking and other bonding techniques.

Figure 9:
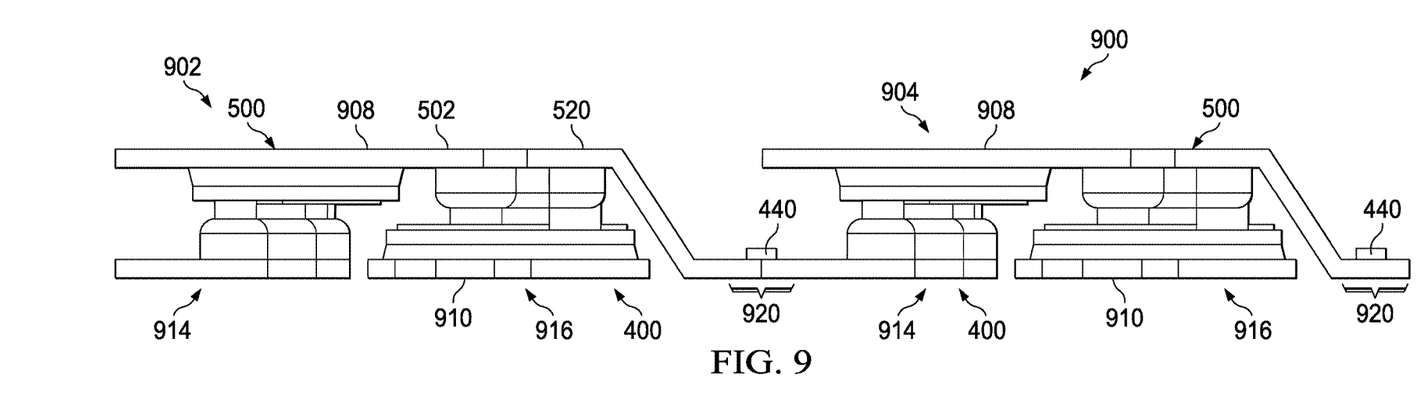
FIG. 9 is a side, cutaway view of a structure containing a first FET device and a second FET device.
Figure 11:
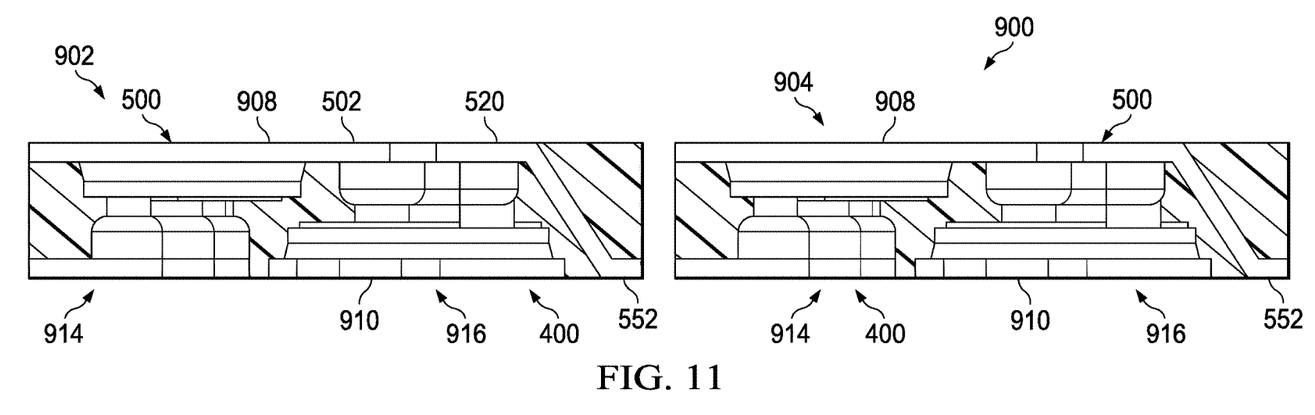

FIG. 9 is a side, cutaway view of a structure 900 containing a first FET device 902 and a second FET device 904. The view of the structure 900 does not show molding compound, however, it would extend between top surfaces 908 and bottom surfaces 910 of the FET devices 902 and 904. Each of the FET devices 902 and 904 has two FETs, which are the aforementioned first FET 914 and the second FET 916. The devices are singulated along singulation lines 920 that pass through the retainers 440. Accordingly, the singulation breaks any electrical contact between the first lead frame 400 and the second lead frame 500 so that the leads 550 and 552 (not shown in FIG. 9) do not electrically contact the first lead frame 400. After singulation, the ends of the leads 550 and 552 are exposed and serve as electrical conductors for their respective devices 902 and 904, as shown in FIG. 11.

Figure 10:
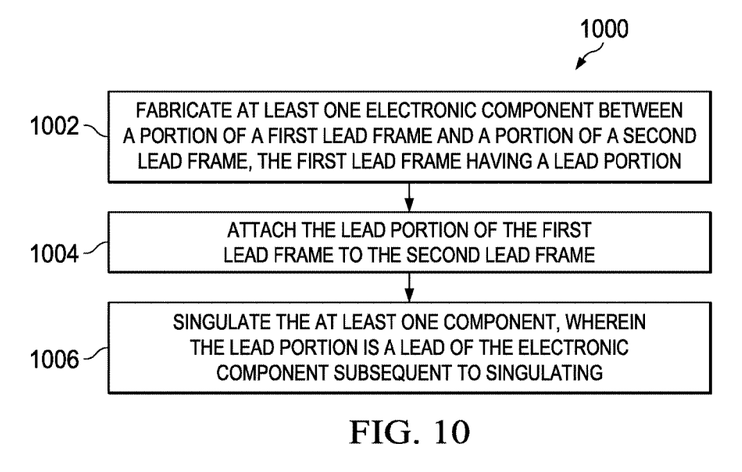
FIG. 10 is a flow chart describing an example method of manufacturing the structure of FIG. 9.

FIG. 10 is flow chart 1000 describing an example method of manufacturing a device with two lead frames as described above. Step 1002 includes fabricating at least one electronic component between a portion of a first lead frame and a portion of a second lead frame, the first lead frame having a lead portion. Step 1004 includes attaching the lead portion of the first lead frame to the second lead frame. Step 1006 includes singulating the at least one component, wherein the lead portion is a lead of the electronic component subsequent to singulating.

The devices described above are fabricated with dual transistors for illustration purposes. In other embodiments, the devices are fabricated with other components, such as single transistors. The integrally formed leads described above reduce the electrical resistance from the leads to the components and increases the thermal conductivity. For example, the integrally formed leads enable the efficient transfer of heat without conducting the heat through bonding materials as with conventional devices.

While some examples of integrated circuits have been described in detail herein, it is to be understood that the inventive concepts may be otherwise variously embodied and employed and that the appended claims are intended to be construed to include such variations except insofar as limited by the prior art.

What is claimed is:

1. A method of fabricating a circuit, the method comprising:
    placing at least one electronic component between a portion of a first lead frame and a portion of a second lead frame, the first lead frame having a lead portion, the lead portion residing on a different plane than the first lead frame because of a transition, the second lead frame having at least one conductive clip on a same plane as the second lead frame;
    attaching the lead portion of the first lead frame to the at least one conductive clip of the second lead frame by swaging;
    singulating individual components from the first lead frame and the second lead frame, wherein the lead portion is a lead of the electronic component subsequent to singulating.

2. The method of claim 1, wherein the singulating breaks any electrical contact between the at least one conductive clip and the first lead frame.

3. The method of claim 1, further comprising encasing at least the lead portion in a mold compound prior to singulation.

4. The method of claim 3, wherein at least a portion of the lead portion is exposed from the mold compound after singulation.

5. The method of claim 1, wherein the swaging includes crushing the lead portion of the first lead frame into the at least one conductive clip of the second lead frame to secure the lead portion of the first lead frame.

6. The method of claim 5, wherein the lead portion of the first lead frame does not move when the pressures associated with molding are applied to the first lead frame and the second lead frame.

7. The method of claim 1, wherein the swaging includes deforming the lead portion of the first lead frame into the at least one conductive clip of the second lead frame to secure the lead portion of the first lead frame.

8. The method of claim 7, wherein the lead portion of the first lead frame does not move when the pressures associated with molding are applied to the first lead frame and the second lead frame.

9. The method of claim 1, wherein the singulating breaks any electrical contact between the first lead frame and the second lead frame.

10. The method of claim 1, wherein the electronic component is a dual field effect transistor (dual FET) circuit.

* * * * *